United States Patent [19]

Kalter

[11] 3,993,917
[45] Nov. 23, 1976

[54] PARAMETER INDEPENDENT FET SENSE AMPLIFIER

[75] Inventor: Howard Leo Kalter, Colchester, Vt.

[73] Assignee: International Business Machines Corporation, Armonk, N.Y.

[22] Filed: May 29, 1975

[21] Appl. No.: 581,984

[52] U.S. Cl. .................. 307/235 F; 307/235 H; 307/238; 307/DIG. 3; 340/173 CA
[51] Int. Cl.² ................ H03K 5/20; H03K 5/18; H03K 3/286; G11C 11/40
[58] Field of Search ...... 307/238, 246, 279, DIG. 3, 307/235 F, 235 H; 340/173 R, 173 CA

[56] References Cited
UNITED STATES PATENTS

| 3,549,912 | 12/1970 | Lewis | 307/291 X |
| 3,678,473 | 7/1972 | Wahlstrom | 307/279 X |
| 3,774,176 | 11/1973 | Stein et al. | 307/DIG. 3 X |
| 3,882,326 | 5/1975 | Kruggel | 307/235 F X |
| 3,892,984 | 7/1975 | Stein | 307/238 X |

OTHER PUBLICATIONS

Furman, "Sense Latch Circuit for Memory Cells"; *IBM Tech. Discl. Bull.*, vol. 16, No. 9, pp. 2792–2793, 2/1974.

West, "Practical Circuit Design Using M.O.S."; *Design Electronics* (publication) pp. 30–32 & 37–38; 3/1971.

Spampinato, "Differential Sense Amplifier"; *IBM Tech. Discl. Bull.*; vol. 17, No. 6; pp. 1797–1798; 11/1974.

*Primary Examiner*—John S. Heyman
*Assistant Examiner*—Larry N. Anagnos
*Attorney, Agent, or Firm*—Howard J. Walter, Jr.

[57] ABSTRACT

A high speed ratioless FET sense amplifier for sensing stored information in a semiconductor memory system. The amplifier is capable of sensing very small voltage signals provided by charges stored in a plurality of single FET/capacitor memory cells. The amplifier comprises a pair of cross-coupled FET devices coupled to a pair of bit/sense lines by clock signal responsive switching devices. The source electrodes of the cross-coupled FETs are each independently capacitively coupled to another clock signal and also to a source of low potential through a pair of clock driven source pull-down FETs. The amplifier uses minimal size devices and is process parameter independent.

26 Claims, 3 Drawing Figures

PARAMETER INDEPENDENT FET SENSE AMPLIFIER

BACKGROUND OF THE INVENTION

1. Field of the Invention

This invention relates to semiconductor memory systems and particularly to information sense amplifiers for single FET/capacitor memory cells.

2. Description of the Prior Art

U.S. Pat. No. 3,387,286 entitled "Field Effect Transistor Memory", issued June 4, 1968, to R. H. Dennard and assigned to the present assignee, describes an array of semiconductor memory cells, each comprising only a single FET coupled to a storage capacitor. Because of the relatively lower cost of FET processing over bipolar processing and the inherent optimum density achievable using a single active device in a memory cell, the approach to designing high density semiconductor memory systems has, in recent years, emphasized the development of single FET/capacitor memory cell technology.

A typical sense amplifier and memory system configuration for such memory cells appears in U.S. Pat. No. 3,678,473 entitled "Read-Write Circuit for Capacitive Memory Arrays", issued July 18, 1972, to S. E. Wahlstrom, which includes a ratioless cross-coupled sense latch coupled between common bit lines of a pair of single FET/capacitor memory arrays. A charged or uncharged memory capacitor is coupled to one bit line and a reference potential is coupled to the other bit line, the differential potential between the bit lines is sensed. In large memory systems where the parasitic capacitance of the bit/sense line is large compared with the storage capacitance, the sense signal is severely attenuated due to the charge redistribution between the small storage capacitance and the large bit/sense line capacitance. In practical FET devices any imbalances, such as differences in the threshold voltages of the cross-coupled devices, or differences in bit line capacitance, requires that a sense signal larger than the minimum achievable through cell design be provided to offset any mismatch. In addition, the speed at which the latch can be set is limited by the size of the bit/sense line capacitance which must be driven to high and low signal levels. The article, "Sense Latch Circuit for Memory Cells", by A. Furman et al. *IBM Technical Disclosure Bulletin*, February 1974, pp. 2792–3, provides clock driven isolation devices between the latch sense nodes and the bit/sense lines to isolate the bit/sense line capacitance from the latch circuit at the time the latch is being set.

Additional improvements in sense amplifier design are taught in U.S. Pat. No. 3,764,906 entitled "Stored Charge Detection by Charge Transfer", issued Oct. 9, 1973, to L. G. Heller and assigned to the instant assignee, which teaches a charge transfer, or bucket brigade, sensing technique which is insensitive to device parameters and can effectively transfer the storage capacitor voltage directly to the sense node. This technique, although more sensitive to input voltages, is slower than the dynamic latch due to the time required to fully charge the large bit/sense line capacitance through an FET approaching cutoff while operating in the saturation region. Improvements in charge transfer sense amplifiers are found in U.S. Pat. No. 3,760,381, entitled "Stored Charge Memory Detection Circuit", issued Sept. 18, 1973, to Y. L. Yao and assigned to the instant assignee, and in the article "Differential Sense Amplifier" by D. P. Spampinato, *IBM Technical Disclosure Bulletin*, November 1974, pp. 1797–8.

In summary, two different types of sense amplifiers have been previously proposed for use with single FET/capacitor memory cells. The dynamic cross-coupled latch, although faster, remains device parameter sensitive and therefore requires a larger input signal, while the charge transfer sense amplifier is more sensitive but slower.

Three additional prior art references are pertinent to certain aspects of the subject invention and, although they relate to diverse areas of the semiconductor art, are described below:

U.S. Pat. No. 3,549,912, entitled "JK Flip-Flop", issued Dec. 22, 1970 to R. G. Lewis, describes a bipolar flip-flop circuit which uses a capacitively coupled clock signal combined with pulse steering diodes to disable the conductive one of a pair of cross-coupled transistors in order to allow the static state of the flip-flop to be more quickly changed.

The article, "Sense Amplifier for IGFET Memory", by D. L. Critchlow, *IBM Technical Disclosure Bulletin*, November 1970, pp. 1720–2, shows a cross-coupled FET sense/latch circuit in which the source electrodes of the cross-coupled FETs are coupled to separate voltage nodes from which an output signal is derived. The nodes are initially unconditionally prebiased to the same DC potential.

U.S. Pat. No. 3,854,059, entitled "Flip-Flop Circuit", issued Dec. 10, 1974, to K. Nomiya et al., shows an FET flip-flop in which cross-coupled devices, having isolated source electrodes, are initially precharged. The circuit also includes separate source pull-down devices for each of the cross-coupled FET devices. In operation the circuit is responsive to logical input signals selectively applied to the precharged source nodes prior to activation of the source pull-down devices. Regenerative operation is prevented by a feedback interrupting device conditioned to be conductive only during a precharge period.

SUMMARY OF THE INVENTION

The circuit of this invention provides a further improvement in sense amplifiers which overcomes the above problems through the use of a cross-coupled FET latch coupled to a pair of bit/sense lines by isolation gates. The source electrodes of the cross-coupled FETs are isolated from each other and are independently prebiased to a potential determined by the threshold of each FET. After the signal to be sensed is placed on the latch nodes and isolated, a high DC impedance means drives the precharged source nodes negatively at a constant rate. The initial differential input signal is increased by charge transfer amplification between a relatively small drain capacitance and a relatively large source capacitance to enable an extremely small input signal to be effectively amplified to the point that the cross-coupled FET devices may be used as a latch. The latch is set by connecting both source nodes to a reference potential. Once the latch is set the isolation gates are opened allowing one bit/sense line to discharge to the reference potential.

The foregoing and other objects, features and advantages of the invention will be apparent from the following more particular description of a preferred embodiment of the invention, as illustrated in the accompanying drawings.

DESCRIPTION OF THE PREFERRED EMBODIMENT

Figure 1:
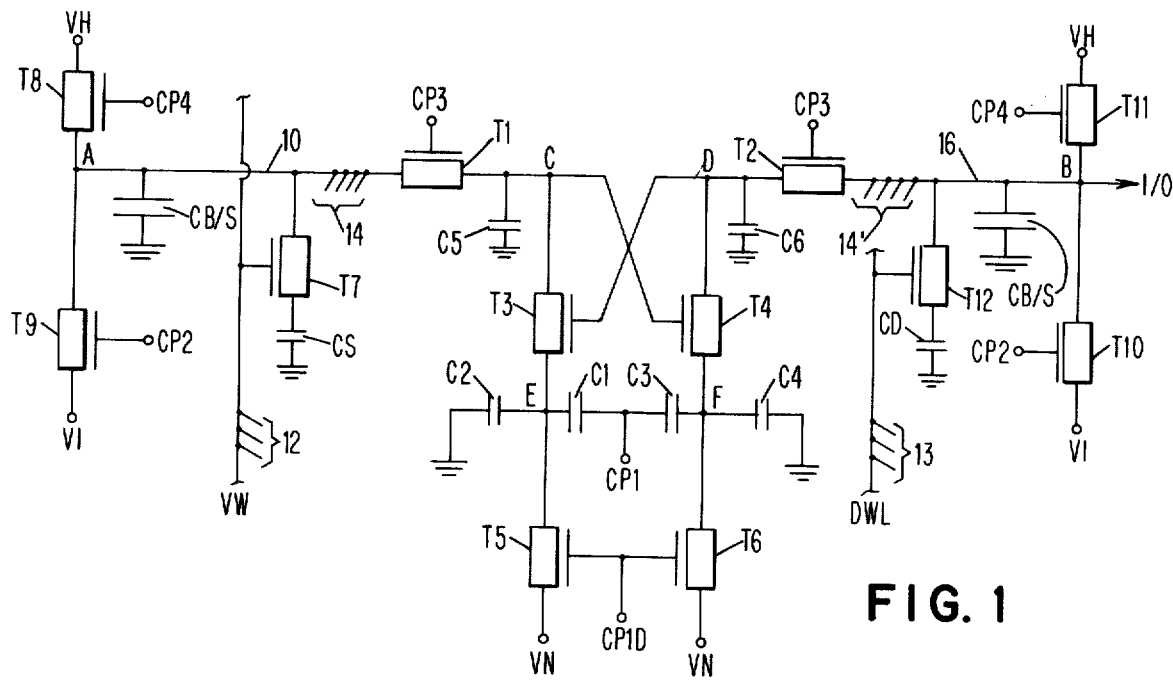
FIG. 1 is a schematic circuit diagram of a portion of a memory system and includes a sense amplifier according to the principles of the present invention.

Referring to FIG. 1 there is shown a schematic circuit diagram of a portion of an integrated circuit memory system which includes a preferred embodiment of the sense amplifier of the subject invention. Although only a single addressable memory cell and sense amplifier are shown, it will be understood by those skilled in the art that, in an actual system, there are normally provided two separate arrays of memory cells organized in rows and columns. In the example shown, columns of memory cells are associated with word accessing lines and rows of memory cells are associated with bit accessing lines, each row having a single sense amplifier. Although differential sensing between two arrays is preferred, the use of a single array having sense amplifiers placed along one edge may also be used, provided certain modifications are made.

Each memory array includes a plurality of charge storage cells comprising a gating FET T7 for selectively coupling a storage capacitor CS to a bit/sense line 10 in response to an address signal VW provided by a word decoder, not shown. VW also drives an additional number of memory cells, as indicated by reference numeral 12, associated with other bit positions. Each bit/sense line also has coupled to it an additional number of memory cells, designated 14, and 14', which are associated with different addressable word lines. Bit/sense line 10 has an inherent capacitance CB/S which is rather large when compared with storage capacitor CS. On the other side of the sense amplifier there is a second bit/sense line 16 which normally has the same number of memory cells associated with it as bit/sense line 10, as known in the art. Each bit/sense line also has associated with it one reference level providing means, or dummy memory cell, comprising, for example, device T12, responsive to dummy cell select signal DWL, and a capacitor CD. DWL also drives additional dummy cells, as indicated by reference numeral 13. During each sensing cycle the dummy cell associated with the bit/sense line on which a memory cell is not to be addressed is selected. Since only the memory cell on the left bit/sense line is illustrated, only the right dummy cell is shown.

Also associated with each bit/sense line are precharge devices T9 and T10 which are responsive to clock pulse CP2 and serve to charge each bit/sense line to an intermediate potential level VI when CP2 is true, positive in the illustrated case of n-channel MOSFET devices. Since it is preferable to store data charge levels at the highest available power supply level, restore devices T8 and T11 are provided to apply a high potential VH to the bit lines at clock pulse CP4 time.

The sense amplifier comprises a pair of bit line isolation devices T1 and T2 which are normally conditioned to be conductive in the linear region in response to clock pulse CP3. T1 and T2 serve to couple input signals to the sense amplifier and also to isolate the amplifier from the rather large bit/sense line capacitance CB/S as will be explained in more detail below. Within the sense amplifier and connected to isolation gates T1 and T2 are cross-coupled devices T3 and T4. The drain and gate electrodes of T3 and T4 are cross-coupled to provide a regenerative feedback circuit.

Associated with the drain electrodes of T3 and T4 are parasitic capacitances C5 and C6. The source electrodes of T3 and T4 are each independently coupled to a pair of pull-down devices T5 and T6, which are responsive to clock pulse CP1D. T5 and T6 serve to couple the source nodes of T3 and T4 to a low, or negative, potential VN when the latch is to be set. Capacitors C1 and C3 are also coupled to the source electrodes of T3 and T4 and are responsive to clock pulse CP1 which initiates the sense/amplification portion of the memory cycle.

Data may be read into and out of any of the memory cells by any of several techniques. As shown in FIG. 1 it is preferable to provide input/output signals I/O through bit/sense line 16. However both bit/sense lines could be used as well as coupling the I/O signal directly to the sense nodes C and D.

Figure 2:
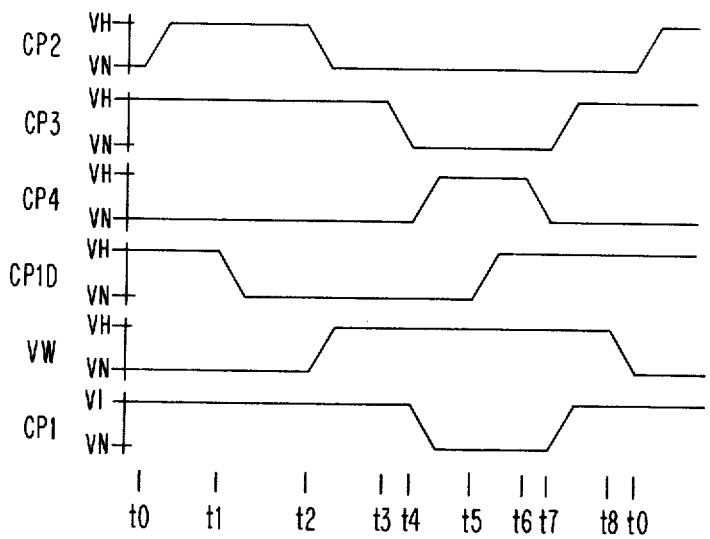
FIG. 2 is a timing diagram illustrating a typical pulse program sequence for operating the circuit of FIG. 1.

Referring now to FIGS. 1 and 2 the operation of the sense amplifier will be described. Three power supply potential levels are used: VH refers to the highest power supply potential available, normally VDD, VN refers to the lowest power supply potential, normally VSS, and VI to a potential intermediate VH and VN. VI may be selected to provide a bit/sense line potential equal or greater than the potential intended to be stored as a charge on a storage capacitor. For purposes of illustration it will be assumed that the state of the amplifier has been previously set such that bit/sense line 10 (voltage node A) is at VH–V$t$, where V$t$ is the threshold voltage of T8, being previously charged through T8 by CP4, and that bit/sense line 16 (voltage node B) is at VN, having been discharged through devices T2, T4, and T6. Just prior to $t$o, CP3 is at VH, CP1 at VI, CP2, CP4 and VW are at VN and CP1D is at VH. At $t$o CP2 goes to VH, bit/sense line 10 starts discharging towards VI and bit/sense line 16 starts charging towards VI. CP1D remains at VH long enough to guarantee that voltage nodes E and F start charging from a potential below VI–V$t$. At $t$1 time, CP1D falls to VN turning off T5 and T6 allowing nodes E and F to charge up to within one threshold of the final voltage at nodes C and D, respectively. Nodes E and F will restore to different potential levels due to differences in their individual threshold voltages. Bit/sense lines 10 and 16 and nodes C and D will restore to VI, as CP2 and CP3 are at VH. At equilibrium, node E will restore to the potential at node D (VI) less the threshold voltage Vt3 of T3 and node F will restore to the voltage at node C(VI) less the threshold voltage Vt4 of T4. T3 and T4 will become non-conductive, as parasitic source capacitances will have been charged. At t2 CP2 returns to VN turning off T9 and T10 and word line potential VW (and also dummy word line potential DWL) rises from VN to VH to turn on T7 coupling the signal stored on storage capacitor CS onto bit/sense line 10. At the same time a reference potential equal to one-half the differential normally provided by a fully charged stored capacitor and a fully discharged storage capacitor is applied to bit/sense line 16 by dummy storage capacitor CD.

The amplifier is responsive to an input signal on node C(D) equal or greater than 0 and a change in potential on node D(C) equal to a negative sensitivity threshold, dependent upon various device mismatches, of $-\Delta V1$, or a change in potential on node C(D) equal or greater than $-2\Delta V1$ and a change in potential on node D(C) equal to $-\Delta V1$. At t3, after data has been introduced to node C, or D, CP3 turns off T1 and T2, decoupling the large bit/sense line capacitance CB/S from the amplifier. At t4, CP4 turns on to restore both bit/sense lines toward VH through T8 and T11. Since VW is still at VH, a logical "one" or charged condition is unconditionally applied to the storage capacitor being read. The dummy cell is also restored. As CP4 rises (see FIG. 3) it causes CP1 to begin to fall toward VN. CP1 causes a known charge Q to be coupled at a constant rate through each of capacitors C1 and C3 to cause the potential on nodes E and F to drop as a function of the ratio of C1 to C2 and C3 to C4. Although the source potentials of T3 and T4 may be at different potential levels, due to differences in their threshold voltages, it is important that the change in gate drive, i.e. (VG–Vt–VS), where VG is the gate potential and VS is the source potential, is increased at a constant rate in order to provide proper operation of the circuit. Since T3 and T4 were previously non-conductive, a voltage drop $(-\Delta V)$ on nodes E and F will cause one of them to just turn on in the saturation region. T3 or T4 will act as a constant current limited device allowing the charge Q removed from nodes E and F to be accurately coupled from node C or D. One of the cross-coupled devices T3 or T4, with the highest gate drive will turn on, allowing either node C or D to be discharged by an amount which is a function of the ratios of the capacitances of the drain and source electrodes of T3 or T4 and the $-\Delta V$ coupled out of the source node. If the parasitic capacitance C5 and C6 at the isolated drain electrodes (nodes C and D) of T3 and T4 is minimized, the amplified voltage across nodes C and D will be large enough to completely mask any threshold mismatch between devices T3 and T4. As the potential on the source electrode of the conductive cross-coupled device falls, charge transfer amplification will occur on the drain node. As $-\Delta V$ further increases the conductive device will begin to operate in the linear region causing node C or D to fall rapidly to the applied source potential. The other cross-coupled device will remain non-conductive as the gate drive remains substantially constant due to the regenerative feedback which insures that the gate potential will fall at least as fast as the source potential. At t5, CPID turns T5 and T6 on shorting nodes E and F to VN causing the differential signal between nodes C and D to be further amplified. At t6 CP4 drops to VN, isolating the bit/sense lines from VH. At t7, CP3 rises to VH allowing the bit/sense lines to be coupled to nodes C and D. Because of the latched state of T3 and T4, one of the bit lines will be discharged to VN. If a logical one, corresponding to a charge of VH–VE in storage capacitor CS, has been sensed, bit/sense line 16 will discharge. At t8 VW returns to VN trapping the proper potential on storage capacitor CS, thus ending the cycle.

Figure 3:
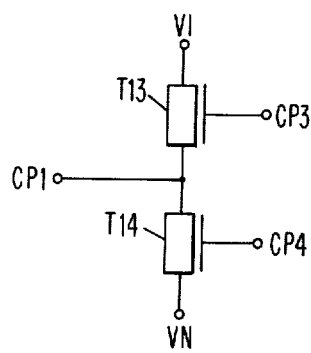
FIG. 3 is a schematic drawing illustrating the generation of clock pulse CP1 from clock pulses CP3 and CP4 and voltage sources VI and VN.

FIG. 3 shows a typical circuit which can be used to generate clock pulse CP1 from clock pulses CP3 and CP4 from potential supplies VI and VN. During the time that CP3 is positive device T13 applies VI to the output. When CP4 is positive T14 will apply VN to the output.

While the subject invention relies on charge transfer amplification to provide additional amplification of the input signal, certain processing technologies may make it undesirable to provide the proper ratio of drain to source capacitances. In such a case regenerative feedback alone may be relied upon to provide the differential voltage necessary to set the latch. In addition other sensing means or latching configurations may be used which are responsive to the amplified differential voltage at nodes C and D.

Data is written in a similar manner as sensing except that the level on the appropriate bit/sense line is forced to a potential level higher than that provided when sensing a charged storage capacitor, or lower than that provided when sensing an uncharged storage capacitor.

While conventional latch type sense amplifiers have an input sensitivity of about 250–500 millivolts, the subject sense amplifier has an input sensitivity in the range of about 2–20 millivolts, depending upon performance required. This improvement in response is due to the initial precharging of the source nodes of the cross-coupled devices and to the decrease in source potentials at a constant rate. It will be recognized that variations in pulse amplitude and timing will permit operation without a dummy cell and/or allow the use of T1 and T2 as charge transfer amplifiers.

Although the invention has been described in terms of a single embodiment, those skilled in the art will recognize that various modifications previously described by others and obvious extentions of the subject invention may be made. For example, other types of devices may be used to perform various functions of the invention. Since the cross-coupled FETs are operated in the saturation region during the amplification stage of the sensing cycle, other current-limited conduction devices exhibiting a controllable threshold may be substituted therefor, and, although the invention has been described in a single FET/capacitor memory cell environment, other charge storage means may be utilized.

What is claimed is:

1. A signal sensing amplifier circuit comprising:
   first and second field effect transistors, each having a source, drain and gate electrode, said first and second transistors having respective conduction threshold voltages, each of said source and drain electrodes having an associated capacitance;
   first and second pairs of voltage nodes;
   means for coupling said drain electrodes to said first pair of voltage nodes and said source electrodes to said second pair of voltage nodes;
   means coupling the drain electrode of each of said field effect transistors to the gate electrode of the other of said field effect transistors for providing regenerative feedback of signals between said transistors;
   a source of charging potential;
   means for precharging said drain electrode capacitances of said transistors to cause said associated source electrode capacitance of said first transistor to be independently charged to a potential substantially equal to said charging potential less said respective conduction threshold voltage and to cause said associated source electrode capacitance of said second transistor to be independently charged to a potential substantially equal to said charging potential less said respective conduction threshold voltage;

means for coupling a differential input signal to one of said pairs of voltage nodes;

first and second capacitors, each having first and second electrodes, said first electrodes being coupled to one of said pairs of voltage nodes; and drive means coupled to said second electrodes of said capacitors for simultaneously driving the potentials of said second electrodes of said capacitors in a direction which tends to increase the gate drive of both of said transistors at a substantially constant rate to cause charge transfer amplification of the potential on the associated drain capacitance of at least one of said transistors and to allow regenerative feedback between said transistors.

2. The signal sensing circuit of claim 1 wherein said differential input signal is applied to said first pair of voltage nodes.

3. The signal sensing circuit of claim 2 wherein said drive means is coupled to said second pair of voltage nodes.

4. The signal sensing circuit of claim 1 further including clock signal responsive means for establishing a substantially steady state latched condition of said transistors in response to the charge transfer amplified differential potential present on the drain capacitances of said transistors.

5. The signal sensing circuit of claim 4 wherein said clock signal responsive means comprises third and fourth field effect transistors for respectively coupling the source electrodes of said first and second transistors to a source of reference potential.

6. In a semiconductor memory system including a plurality of addressable charge storage means associated with a common bit/sense line, said bit/sense line having an associated capacitance, a sense amplifier comprising:

first and second cross-coupled field effect transistors coupled to said common bit/sense line, each of said transistors having a gate, drain and source electrode and associated electrode capacitances, each of said transistors further having a threshold voltage, the drain electrode of each transistor being coupled to the gate electrode of the other of said transistors;

biasing means for applying a gate bias potential to the gate electrodes of said first and second transistors for a time period sufficient to independently charge the associated source capacitances of said first and second transistors to potentials equal to the applied gate bias potential less the respective threshold voltages of said first and second transistors;

means for coupling the charge stored in one of said charge storage means to said common bit/sense line to cause an input potential to be coupled to at least one of the electrodes of one of said first and second transistors;

reference potential providing means for coupling a reference potential to at least one of the electrodes of the other of said first and second transistors; and drive means capacitively coupled to at least one of the electrodes of each of said first and second transistors for driving said last said electrodes in a direction which tends to increase the gate drive of said first and second transistors to provide charge transfer amplification of the potentials on the drain electrodes of said first and second field effect transistors.

7. The sense amplifier of claim 6 wherein said drive means comprises capacitive coupling means responsive to a clock signal.

8. The sense amplifier of claim 7 wherein said capacitive coupling means comprises a first and second capacitors respectively coupled to the source electrodes of said first and second transistors.

9. The sense amplifier of claim 6 further including a third field effect transistor between said common bit/sense line and said cross-coupled transistors to isolate said bit/sense line capacitance from the capacitance associated with the electrodes of said one of said first and second transistors.

10. The sense amplifier of claim 6 wherein said reference potential providing means comprises a second bit/sense line common to an additional plurality of addressable charge storage means.

11. The sense amplifier of claim 10 wherein said reference potential providing means includes a charge coupling means for coupling charge on said second bit/sense line to said other of said first and second transistors.

12. The sense amplifier of claim 6 wherein said reference potential equals a potential intermediate the input potential provided by a fully charged storage means and the input potential provided by an uncharged storage means.

13. A signal sense amplifier comprising:

first and second cross-coupled current-limiting conduction devices, each of said devices having a first and second current conducting electrode and a control electrode, the control electrode of each of said devices being coupled to the second current conducting electrode of the other of said devices, the conductive state of said current-limited conduction device being determined by the presence of a minimum threshold voltage differential between said control electrode and said first current conducting electrode;

first and second capacitive means respectively coupled to said first and second current conducting electrodes of each of said current-limiting conduction devices, said first capacitance being larger than said second capacitance;

means for applying a precharge bias potential to said current conducting electrodes to cause independent charging of said first capacitive means to a potential determined by the respective threshold voltages of said first and second current-limited conduction devices;

means for applying a differential input voltage signal to one of said current conducting electrodes of each of said current-limited conduction devices;

drive means capacitively coupled to one of said current-conducting electrodes of each of said devices for increasing the potential difference between said control and said first current conducting electrodes of said current-limited conduction devices to cause a quantity of charge to be transferred between said first and second capacitive means of one of said current-limited devices to provide amplification of the voltage signal on one of said second capacitances as determined substantially by the ratio of the capacitances of said first and second capacitance means.

14. The signal sense amplifier of claim 13 wherein said drive means comprises a first clock signal capacitively coupled to said one of said current conducting electrodes of each of said current-limited conduction means through a third and fourth capacitance means.

15. The signal sense amplifier of claim 14 wherein said third and fourth capacitance means are coupled to said first current conducting electrodes.

16. The signal sense amplifier of claim 15 further including second clock responsive low impedance switch means coupled between said first current conducting electrodes and a source of reference potential to cause said first electrodes to be clamped to said reference potential after amplification of said input signal has occurred to cause regenerative latching and further amplification of said input signal.

17. The signal sense amplifier of claim 13 wherein the rate of potential increase between said control and said first current conducting electrodes provided by said drive means is less than the transient response rate of the amplified signal on said one of said second capacitive means in order to prevent the threshold voltage of the other of said current-limited conduction devices from being exceeded.

18. A memory system comprising:
a plurality of charge storage memory cells, each comprising an addressable switching means and a storage capacitor;
first and second bit/sense lines, each coupled to a plurality of said switching means, each of said bit/sense lines having an associated bit/sense capacitance;
differential sense amplifier means comprising:
first and second cross-coupled constant-current conducting devices, each of said devices having a first and second current conducting electrode and a control electrode, a voltage differential between said first current conducting electrode and said control electrode in excess of a process parameter dependent threshold voltage causing said devices to assume a conductive state;
first and second capacitance means associated, respectively, with said first and second current conducting electrodes of each of said constant current conducting devices, said second capacitance means being smaller than said first capacitance means;
precharge means for precharging said second capacitance means to a potential in excess of the threshold voltages of said first and second current-limited conduction devices to provide an independnet precharge potential on said first capacitance means corresponding substantially to the potential on said control electrode less said respective process parameter dependent threshold voltages;
drive means capacitively coupled to said first current conducting electrodes for applying a substantially constant rate of potential increase between said control electrodes and said first current conducting electrodes of said current-limited conduction devices to cause at least one of said devices to become conductive in the presence of a differential input signal presented to one of said first and second electrodes of each of said devices and to provide charge transfer amplification of the potential on said second capacitance of said one conductive device; and
means for coupling a signal to be sensed from one of said bit/sense lines to one of said first and second current conducting electrodes of each of said current-limited conduction devices.

19. The memory system of claim 18 wherein said switching means and said current-limited conduction devices comprise field effect transistors.

20. The memory system of claim 18 further including clock responsive isolation means to isolate said bit/sense line capacitance from said sense amplifier after the signal to be sensed has been applied to said sense amplifier.

21. The memory system of claim 20 wherein said signal to be sensed is coupled to said second capacitance means of one of said current-limited conduction devices and said drive means is applied in parallel to said first current conducting electrodes through a first and second coupling capacitor.

22. A differential sense amplifier comprising:
first and second three-terminal devices, each having a control electrode and a first and second current conducting electrode, said devices having the characteristic that the maximum potential achievable on said second current conducting electrode as a function of the potentials on said control and first current conducting electrodes is equal to the potential applied to said control electrode less a threshold voltage;
cross-coupling means for cross-coupling said control electrode of each of said devices to said first current conducting electrode of the other of said devices;
capacitance means coupled to the second current conducting electrode of each of said devices;
means for applying a precharge potential to said control electrodes to cause said devices to conduct and to independently charge said capacitance means, said devices being rendered non-conductive when said capacitance means becomes charged to substantially said threshold voltage below said precharge potential;
means for applying a signal to be sensed to at least one of said current conducting electrodes;
clock responsive capacitor coupling means coupled to one of said first and second current conducting electrodes of said devices for causing the potential difference between said control electrodes and said second current conducting electrodes to be increased at a substantially constant rate after said signal to be sensed has been applied to said one of said current conducting electrodes to cause one of said devices to become conductive, said cross-coupling means preventing the non-conductive one of said devices from becoming conductive by regenerative feedback.

23. The differential sense amplifier of claim 22 further including:
clock responsive impedance means for applying a reference potential to said second conductive electrodes of said devices to cause latching of the conductive and non-conductive states of said devices.

24. The differential sense amplifier of claim 22 wherein said capacitor coupling means comprises a first and second capacitor means connected in parallel between a source of clock signals and said second conductive electrodes of said devices.

25. The differential sense amplifier of claim 24 wherein said three-terminal devices comprise field effect transistors.

26. The differential sense amplifier of claim 25 wherein said means for applying said signal to be sensed comprises a charge storing memory cell.

* * * * *

UNITED STATES PATENT OFFICE
CERTIFICATE OF CORRECTION

PATENT NO. : 3,993,917

DATED : November 23, 1976

INVENTOR(S) : Howard Leo Kalter

It is certified that error appears in the above-identified patent and that said Letters Patent are hereby corrected as shown below:

Column 5, line 59, delete "VH-VE" and add --VH-Vt--.

Column 8, Claim 13, line 18, after "said" add --second--.

Signed and Sealed this

Third Day of May 1977

[SEAL]

Attest:

RUTH C. MASON
Attesting Officer

C. MARSHALL DANN
Commissioner of Patents and Trademarks